United States Patent [19]
Rusanov et al.

[11] Patent Number: 5,579,427
[45] Date of Patent: Nov. 26, 1996

[54] GRADED INDEX SINGLE CRYSTAL OPTICAL FIBERS

[75] Inventors: S. Y. Rusanov; A. A. Yakovlev; A. I. Zagumennyi, all of Moscow, Russian Federation

[73] Assignee: Ceram Optec Industries, Inc., East Longmeadow, Mass.

[21] Appl. No.: 356,844

[22] Filed: Dec. 15, 1994

[51] Int. Cl.$^6$ .................................................. G02B 6/18
[52] U.S. Cl. ............................................ 385/124; 65/385
[58] Field of Search ................................ 385/122, 124, 385/142; 372/6, 41; 65/385

[56] References Cited

U.S. PATENT DOCUMENTS

| | | | |
|---|---|---|---|
| 4,040,890 | 8/1977 | Burruo, Jr. et al. | 385/142 X |
| 4,421,721 | 12/1983 | Byer et al. | 422/109 |

OTHER PUBLICATIONS

Sudo et al–Uniform Refractive Index Cladding for LiNbo$_3$ Single–Crystal Fibers–Appl. Phys. Lett 56 1931–33 (1990).
Feigelson et al–Single Crystal Fibers by the Laser–Headed Pedestal Growth Method—Optical Eng. 24 1102–07 (1985) Nov.

*Primary Examiner*—John D. Lee
*Assistant Examiner*—Phan T. H. Palmer
*Attorney, Agent, or Firm*—Bolesh J. Skutnik

[57] ABSTRACT

Single crystal optical fibers are produced with a graded index structure. A modified approach of the Laser-Heated Pedestal Growth [LHPG] method is employed to produce optical fibers from a preform rod. Under laser irradiation, a thermal gradient is created with temperature peaking at the center of the molten zone on top of the preform. Dopant species are radially distributed, across a cross section of the single crystal fibers during their growth. A refractive index gradient, thus, occurs across the fiber's cross section. The gradient is controlled by choice of process parameters and by selection of dopant species which will yield higher dopant concentrations in the melt contacting the central part of the cross section of the growing single crystal fiber than dopant concentrations in the melt contacting the outer edge of the growing single crystal fiber.

10 Claims, 3 Drawing Sheets

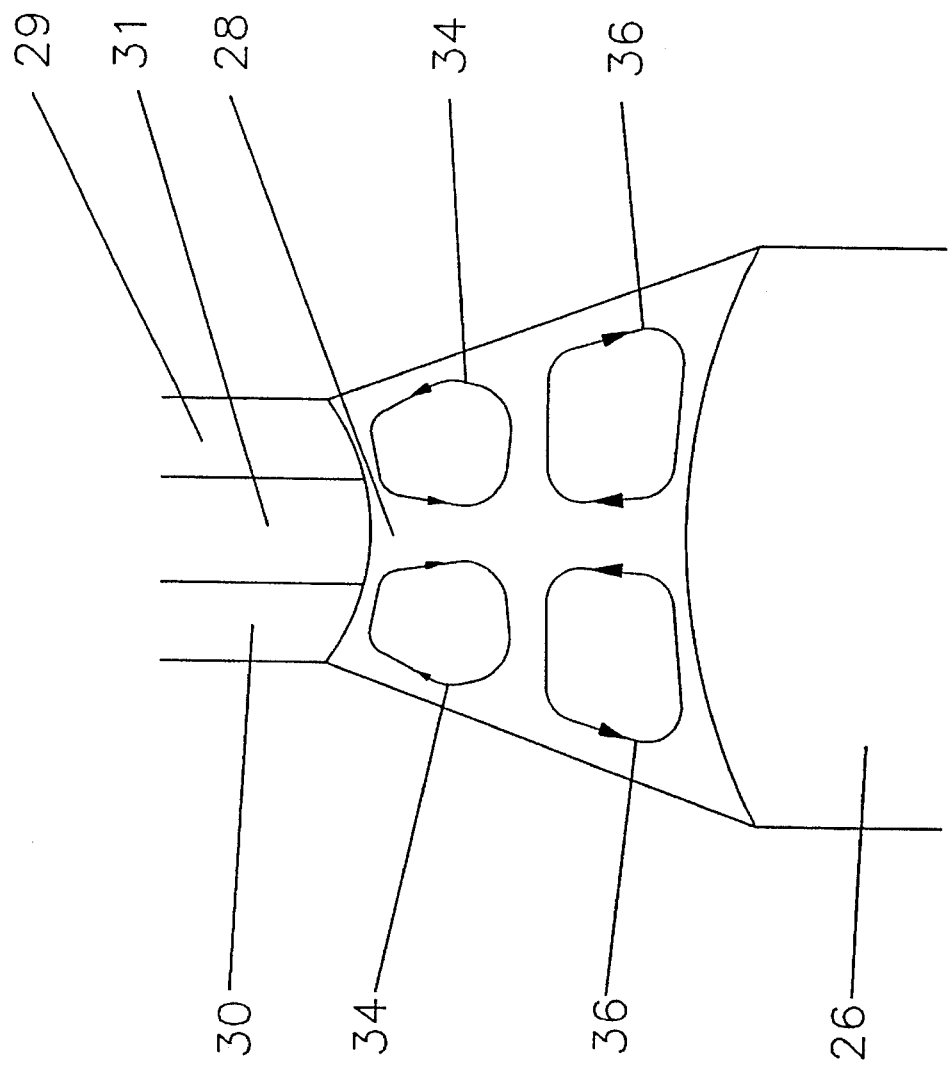

GRADED INDEX SINGLE CRYSTAL OPTICAL FIBERS

BACKGROUND OF THE INVENTION

1. Field of the Invention

The invention relates generally to the class of optical fibers made from single crystals such as sapphire and in particular to a new class consisting of graded index single crystal optical fibers. It also relates to methods of producing such fibers.

2. Invention Disclosure Statement

Generally in the prior art, single crystal optical fibers are clad with plastic materials. It has not been possible to prepare core/clad or graded index structures for single crystal fibers because the fibers must be grown from the melt. It is very difficult to maintain significant variations in concentrations of dopants in a liquidus region. By contrast glassy materials like silica are drawn into fibers from the softened glassy state. The viscosity of the softened glassy state is very high and restricts significant exchange of dopant between layers of the preform Under conventional methods, flow within the liquidus state of the material is thermal gravitational flow which tends to distribute materials, including dopants, randomly and somewhat uniformly throughout the liquidus region.

One solution to the problem has been to grow a single crystal optical fiber and then deposit a dopant layer on the outer surface of the fiber. The dopant is diffused into the fiber by maintaining the fiber at a high temperature for a period of time. Lithium niobate, $LiNbO_3$, single crystal fibers have been doped with magnesium oxide, MgO, by this method. [See S. Sudo, I. Yokohama, A. Cordiva-Plaza, M. M. Fejer and R. L. Byer, Appl. Phys. Lett. 58, 1931 (1990).]

The process required multiple extended exposures to temperatures of about 1050° C. including periods of 2 hours for annealing before depositing the dopant layer and for 40 hours to obtain diffusion to 10 μm into a 90 μm diameter lithium niobate fiber. Overall the process is slow, complex and involves many steps. There are, thus, many places for mistakes to arise, making the production of consistently doped fibers difficult, particularly in quantity. Fabrication costs are also expected to be high and difficult to reduce.

It has also been noted in the literature [R. S. Feigelson, W. L. Kway and R. K. Route, Opt. Eng. 24, 1102 (1985)] that a distribution of laser active dopants in YAG garnets [also single crystals] occurs as the doped single crystals are grown into fibers by the laser heated pedestal growth [LHPG] method. [See e.g., U.S. Pat. No. 4,421,721.] Preliminary micro distribution measurements indicated that samples made by different researchers had varying radial distributions. Note that dopant concentrations required for lasing fibers are not functional for normal graded-index fiber applications. Also the authors implied a uniform radial distribution would make for a good fiber laser.

One of the problems with the current processes to fabricate single crystal fibers is in providing a thermal zone with good axial symmetry in which a small pool of the material can be maintained in the liquid state. A second major problem, as described above, is the need to find a way to establish or maintain a variation in dopant concentration across the radial cross section of the fiber as it is grown from the melt. As noted earlier, alternative methods, which employ deposition of a dopant followed by its diffusion, have problems with complexity, consistency and very slow production rates. It is likely that fabrication costs would be too high for major commercialization.

BRIEF SUMMARY OF THE INVENTION

It is an aim of the present invention to solve these problems and to fabricate single crystal optical fibers with a gradient refractive index and thereby enhance the optical properties of the fiber.

It a further aim of the present invention to provide a process to fabricate single crystal optical fibers which permits creating a distribution of a dopant across a radial cross section of the fiber.

It is also an aim of the present invention to produce a single crystal optical fiber with a gradient refractive index as the fiber is grown from the preform.

Briefly stated in the present invention, single crystal optical fibers are produced with a graded index structure. A modified approach of the Laser-Heated Pedestal Growth [LHPG] method is employed to produce optical fibers from a preform rod.

Under laser irradiation, a thermal gradient is created with temperature peaking at the center of a molten zone on the top of the preform. Dopant species are radially distributed, across a cross section of the single crystal fibers during their growth. A refractive index gradient, thus, occurs across the fiber's cross section. The gradient is controlled by choice of process parameters and by selection of dopant species which will yield higher dopant concentrations in the melt contacting the central pan of the cross section of the growing single crystal fiber than dopant concentrations in the melt contacting the outer edge of the growing single crystal fiber.

The above, and other objects, features and advantages of the present invention will become apparent from the following description read in conjunction with the accompanying drawings, in which like reference numbers in different drawings denote like items.

BRIEF DESCRIPTION OF DRAWINGS

FIG. 3 presents a detailed view of the melt zone, including flow patterns within the liquidus state of the doped material.

DETAILED DESCRIPTION OF PREFERRED EMBODIMENTS

Figure 1:
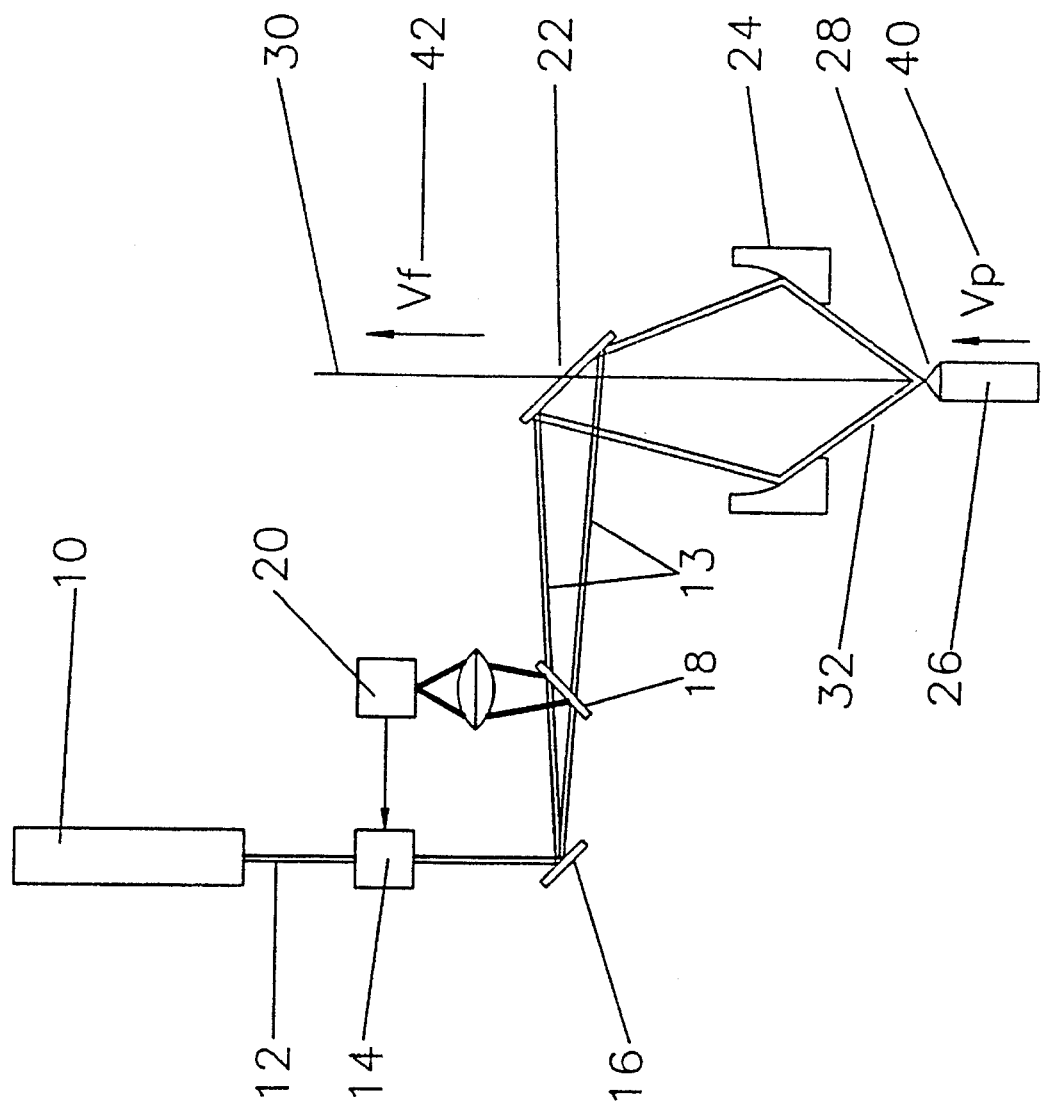
FIG. 1 presents a schematic of a laser system used to grow single crystal fibers.

Referring to FIG. 1, laser 10 generates laser beam 12 whose cross section is transformed from a round shape to a ring one by a "focusator" 16 into laser beam 13. Transformed laser beam 13 passes through a beam splitter 18 to an angled flat mirror 22. Some of transformed laser beam 13 is directed by beam splitter 18 to a power meter 20, which together with optical controller 14 regulates power to laser 10 and maintains a constant laser power during operation.

Transformed laser beam 13 is reflected off flat mirror 22 onto parabolic mirror 24 to form a uniform annular ring of laser power 32 striking preform 26 at one end. Melt zone 28 [liquidus state] is formed on preform 26. When an oriented seed crystal is dipped into melt zone 28 and slowly withdrawn single crystal fiber 30 begins to grow. Dimensions of crystal fiber 30 are determined by initial dimensions of preform 26 and by feed rate 40 of preform 26 relative to growth rate 42 of crystal fiber 30. Standard techniques used in optical fiber production can be employed to maintain a uniform cross sectional area for crystal fiber 30, even if some diameter variations occur for preform 26.

Figure 2:
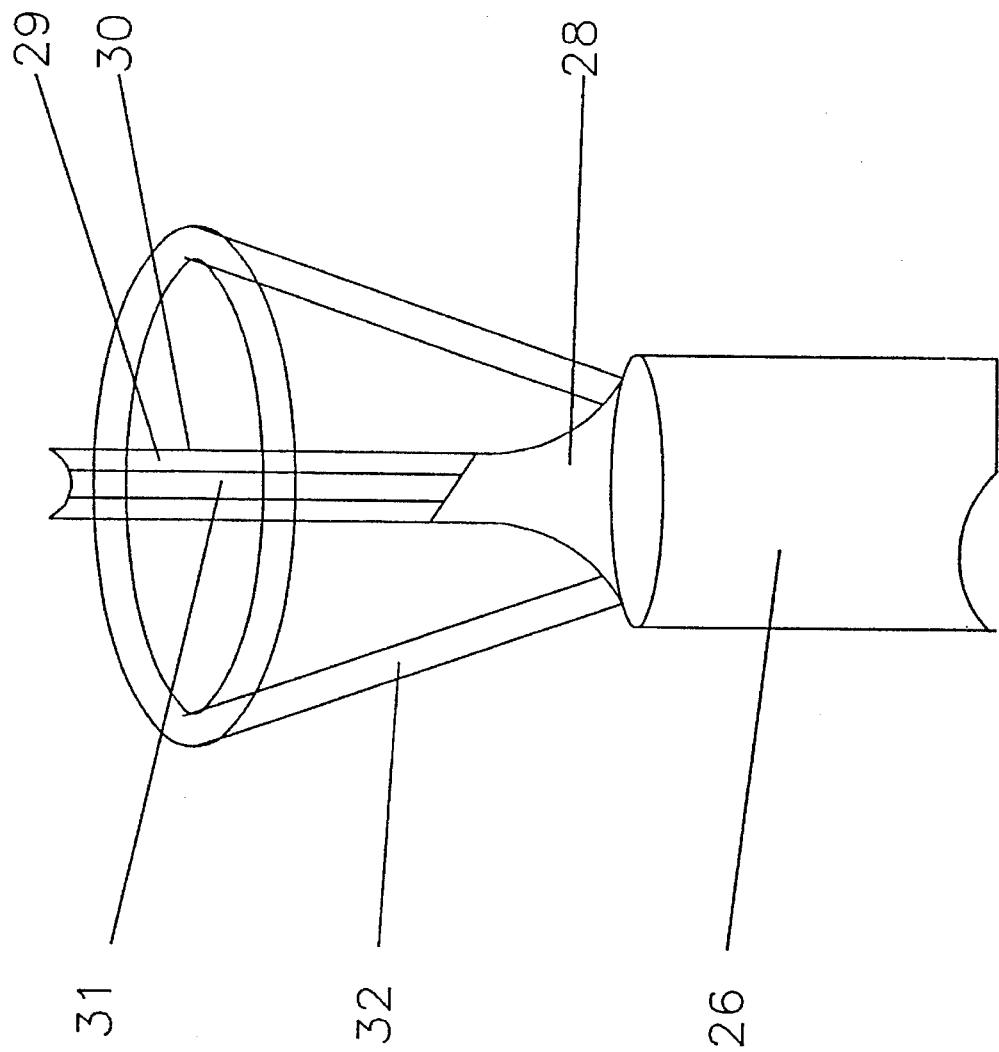
FIG. 2 shows in greater detail the laser beam shape as it strikes a preform rod and the area where the crystal fiber is grown from the molten end of the preform.

In FIG. 2, preform 26 has a melt zone 28 formed at an end where an annular ring of laser power 32 contacts preform 26. A crystal fiber 30 is grown from melt zone 28 by slowly withdrawing a seed crystal from melt zone 28. Melt zone 28 is preferably kept within a height range of 0.5 to 1.5 times diameter 27 of preform 26. Crystal fiber 30 has an outer cross section 29 and a central cross section 31.

In FIG. 3, Marangoni convection flow patterns 34, and 36 are shown near growing crystal fiber 30 and preform 26 within melt zone 28. Dopant concentrations will be enriched in melt zone 28 over crystal fiber 30 by Marangoni convection flow patterns 34. As crystal fiber 30 grows from melt zone 28 dopant concentration in melt zone 28 will also increase over that in preform 26.

Under laser irradiation a thermal gradient is created with a temperature peak on a lateral surface of a melt drop in melt zone 28. This thermal gradient causes thermal capillary flows, i.e. Marangoni flow 34 and 36, on a surface layer of melt zone 28. In Marangoni flow 34, bulk flow in melt zone 28 near growing crystal fiber 30 is directed from an edge of fiber 30 to a central cross section of fiber 30.

During directional crystallization dopant concentration in melt zone 28 near growing fiber 30 will increase when distribution coefficient k, which is given by a ratio of dopant concentration in a solid growing fiber to that in a contacting liquid, $C_s/C_l$, is less than one, k<1, and conversely, when k>1 the dopant concentration will diminish at an interface between growing fiber 30 and melt zone 28. Bulk flow near growing fiber 30 will thus be enriched with dopant when k<1 and will be depleted when k>1. As a result of Marangoni flow 34, outer cross section 29 of crystal fiber 30 is in contact with a portion of melt zone 28 whose concentration of dopants is different from the dopant concentration of melt zone 28 in contact with central cross section 31 of crystal fiber 30. A refractive index gradient is thereby produced in fiber 30.

One embodiment of the present invention is demonstrated by the following example. Yttrium oxide, $Y_2O_3$, at 0.05 mole %, was blended with alumina powder, $Al_2O_3$. The powder blend was pressed to make a preform rod, having a diameter of 2 mm and a length of 50 mm. A 100 watt $CO_2$ laser, set to yield 18 W of 10.6 µm, was focused into an annular ring and aimed at the top of the doped preform rod creating a melt zone, a liquidus state. A seed of alumina was introduced into the melt zone and slowly withdrawn from it. The crystal fiber was grown at a speed of 60 mm/hr as the seed was withdrawn from the melt zone. The liquidus state, during the growing process, was maintained at a height of 2 mm. A single crystal optical fiber of 400 µm diameter and approximately 150 mm long resulted. The concentration of the $Y_2O_3$ was 0.07 mole % in the center of the fiber and 0.02 mole % near the fiber surface.

In another example, a graded index fiber was produced using boron oxide, $B_2O_3$, as the dopant. A powder blend was prepared by mixing 1.0 mole % of $B_2O_3$ in $Al_2O_3$ and then pressing the blend into a preform rod, having a 2 mm diameter and 50 mm length. The uppermost surface of the preform was heated by a $CO_2$ laser beam set to deliver 18 W of power. The laser beam was focused into an annular beam and a melt zone, liquidus state, was formed on the preform top surface. A seed was introduced into the liquidus state and withdrawn at a rate of 45 mm/h. The liquidus state was maintained at a length of 2 mm during the growing process. A single crystal optical fiber of 400 µm diameter and approximately 150 mm long was obtained. The concentration of the $B_2O_3$ was 1.3 mole % in the center of the fiber and 0.6 mole % near the fiber surface.

Typically the temperature in the melt zone varies with laser output and focus and a number of other parameters such as fiber and preform diameters, dopant material and withdrawal rate. At the center of the liquid pool the temperature is generally 10° to 200° C. above the melting temperature of the single crystal material. As a specific example for a 500 µm diameter fiber and a 2 mm diameter preform of doped sapphire, it was found that at a withdrawal rate of 100 mm/h an optimal ΔT lies between 80° and 140° C. above the doped sapphire melting temperature.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A graded refractive index single crystal optical fiber drawn from a doped single crystal:

wherein said doped single crystal comprises a pure single crystal material and at least one dopant homogeneously distributed in said material and being formed into a preform rod;

said optical fiber being grown from a melt region formed on said preform rod;

said optical fiber having a cross section with a central cross section having a different refractive index than an outer cross section;

said at least one dopant is distributed radially across said fiber's cross section so as to achieve said variation in refractive index of said fiber; and wherein if said dopant has a concentration in a solid single crystal fiber of $C_s$ and a concentration in said melt region of $C_l$ such that distribution coefficient $k=C_s/C_l$ is less than one, then said dopant concentration in said central cross section of said fiber is greater than in said outer cross section.

2. A fiber according to claim 1, wherein if dopant has a distribution coefficient k greater than one, then said dopant concentration in said central cross section is less than in said outer cross section.

3. A fiber according to claim 2, wherein said dopant is $Cr_2O_3$.

4. A fiber according to claim 1, wherein said pure single crystal material is sapphire.

5. A fiber according to claim 1, wherein said dopant is selected from a group of materials consisting of: $Y_2O_3$, $B_2O_3$, $Fe_2O_3$, $Bi_2O_3$, $Co_2O_3$, $In_2O_3$, $Sc_2O_3$, $Tl_2O_3$, $La_2O_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$.

6. A graded refractive index single crystal optical fiber drawn from a doped polycrystal:

wherein said doped polycrystal comprises a polycrystalline material and at least one dopant homogeneously distributed in said material and being formed into a preform rod;

said optical fiber being grown from a melt region formed on said preform rod;

said optical fiber having a cross section with a central cross section having a different refractive index than an outer cross section;

said at least one dopant is distributed radially across said fiber's cross section so as to achieve said variation in refraction index of said fiber; and wherein if said dopant has a concentration in a solid single crystal fiber of $C_s$ and a concentration in said melt region of $C_l$ such that distribution coefficient $k=C_s/C_l$ is less than one, then said dopant concentration in said central cross section of said fiber is greater than in said outer cross section.

7. A fiber according to claim 6, wherein if dopant has a distribution coefficient k greater than one, then said dopant concentration in said central cross section is less than in said outer cross section.

8. A fiber according to claim 3, wherein said dopant is $Cr_2O_3$.

9. A fiber according to claim 6, wherein said pure single crystal material is sapphire.

10. A fiber according to claim 6, wherein said dopant is selected from a group of materials consisting of: $Y_2O_3$, $B_2O_3$, $Fe_2O_3$, $Bi_2O_3$, $Co_2O_3$, $In_2O_3$, $Sc_2O_3$, $Tl_2O_3$, $La_2O_3$, $Pr_2O_3$, $Sm_2O_3$, $Eu_2O_3$, $Gd_2O_3$, $Tb_2O_3$, $Dy_2O_3$, $Ho_3O_3$, $Er_2O_3$, $Tm_2O_3$, $Yb_2O_3$, $Lu_2O_3$.

* * * * *